(12) United States Patent
Jang

(10) Patent No.: US 7,405,090 B2
(45) Date of Patent: Jul. 29, 2008

(54) METHOD OF MEASURING AN EFFECTIVE CHANNEL LENGTH AND AN OVERLAP LENGTH IN A METAL-OXIDE SEMICONDUCTOR FIELD EFFECT TRANSISTOR

(75) Inventor: Yong-Un Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 58 days.

(21) Appl. No.: 11/638,001

(22) Filed: Dec. 13, 2006

(65) Prior Publication Data

US 2007/0161194 A1 Jul. 12, 2007

(30) Foreign Application Priority Data

Jan. 12, 2006 (KR) .................... 10-2006-0003451

(51) Int. Cl.
*G01R 31/26* (2006.01)
*H01L 21/66* (2006.01)
*H01L 21/336* (2006.01)

(52) U.S. Cl. .............................. 438/14; 438/17; 438/18; 438/197; 438/268; 324/769; 257/E21.531

(58) Field of Classification Search .................... 438/14, 438/17, 18, 197, 268; 324/769; 257/E21.531
See application file for complete search history.

(56) References Cited

U.S. PATENT DOCUMENTS 6,166,558 A 12/2000 Jiang et al.

6,472,233 B1 * 10/2002 Ahmed et al. ................. 438/14
6,514,778 B2 2/2003 Huang et al.

FOREIGN PATENT DOCUMENTS

JP 2000-216258 8/2000
JP 2001-338986 12/2001

* cited by examiner

*Primary Examiner*—Scott B. Geyer
*Assistant Examiner*—Mohsen Ahmadi
(74) *Attorney, Agent, or Firm*—Mills & Onello LLP

(57) ABSTRACT

In a method of measuring an effective channel length and an overlap length, first to third metal-oxide semiconductor field effect transistors (MOSFETs) including first to third gate patterns, respectively, are formed on a substrate. A parasitic capacitance between the gate patterns and the substrate in the MOSFETs is determined based on first and second capacitances, which are measured by applying a first voltage between the gate patterns and the substrate. A second voltage is applied between the first gate pattern and the substrate in the first MOSFET and a third voltage between the third gate pattern and the substrate in the third MOSFET to measure capacitances. The capacitances are treated to obtain third and fourth capacitances excluding the parasitic capacitance. Overlap lengths of the gate patterns are obtained based on the third and fourth capacitances. Effective channel lengths of the gate patterns are obtained based on the overlap length.

20 Claims, 9 Drawing Sheets

METHOD OF MEASURING AN EFFECTIVE CHANNEL LENGTH AND AN OVERLAP LENGTH IN A METAL-OXIDE SEMICONDUCTOR FIELD EFFECT TRANSISTOR

CROSS-REFERENCE TO RELATED APPLICATION

This application claims priority under 35 USC § 119 to Korean Patent Application No. 10-2006-0003451 filed on Jan. 12, 2006 in the Korean Intellectual Property Office, the contents of which are herein incorporated by reference in their entirety.

BACKGROUND OF THE INVENTION

1. Field of the Invention

The present invention relates to metal-oxide semiconductor field effect transistors (MOSFET). More particularly, the present invention relates to methods of measuring an effective channel length and an overlap length in a MOSFET having a minute line width.

2. Description of the Related Art

Recently, as information media, such as a computers, are widely used, methods of manufacturing semiconductor devices conforming to increasingly small design rules have been rapidly developed. The semiconductor devices from which cutting-edge information media devices are made require a rapid operation speed and a massive storage capacity. To meet these characteristics, a degree of integration, reliability, a response speed, and so on, of the semiconductor device have been improved.

In order to highly integrate the semiconductor device, it is necessary to have a design rule requiring the size of patterns in the semiconductor device be sufficiently reduced. Particularly, it is required to shorten a channel length of a gate in a MOSFET of the semiconductor device. Further, in order to form a highly integrated MOSFET, a process for verifying a capacity of the MOSFET having a sufficiently reduced channel length and a process for forming the MOSFET are essential.

To verify the MOSFET, parameters of elements in the MOSFET are accurately established. Examples of the parameters of the elements in the MOSFET may include an effective channel length, an overlap length, an overlap capacitance, and so on. The effective channel length and the overlap length are very important parameters relating to process monitoring, capacity of the MOSFET, formation of the MOSFET having reduced sizes, and so on.

Here, as the semiconductor device has been highly integrated, the effective channel length of the MOSFET has been significantly shortened. Thus, the overlap length between a source/drain and the gate becomes an important parameter. Therefore, when the very small MOSFET is modeled, accurate measurements of the effective channel length and the overlap length that have physical significances are required.

Examples of conventional methods of measuring the effective channel length and the overlap length include a current-voltage measuring method (hereinafter, referred to as an "I-V method"), a shift-and-ratio method, a capacitance-voltage measuring method (hereinafter, referred to as a "C-V method"), and so on.

However, in the I-V method and the shift-and-ratio method, since a halo or a pocket-well formation process is used currently, mobility of elements in a long channel is different from that of elements in a short channel, so that measurement accuracy may be low. Further, it is required to accurately measure resistances of the source/drain in the I-V method and the shift-and-ratio method. In contrast, since the C-V method does not have these problems, the effective channel length and the overlap length can be more accurately measured using the C-V method than it can be using the I-V method or the shift-and-ratio method.

A conventional method of measuring an effective channel length and an overlap length using a C-V method is disclosed in U.S. Pat. No. 6,514,778. According to the method in U.S. Pat. No. 6,514,778, a capacitance Cgc between a gate and a source/drain is measured to obtain an effective channel length and an overlap length. However, when a MOSFET has a minute gate line width, the effective channel length and the overlap length might not be accurately measured using the C-V method.

Particularly, in the super minute gate of the MOSFET, a capacitance measured in an accumulation region is not saturated, but is continuously changed in accordance with a gate bias. That is, the effective channel length and the overlap length are changed in accordance with the gate bias that is used for measuring the effective channel length and the overlap length.

Further, the capacitance measured for obtaining the effective channel length and the overlap length can include a parasitic capacitance. The parasitic capacitance has important influence on the determination of the effective channel length and the overlap length in the super minute MOSFET, leading to inaccuracies. However, the above conventional method does not take into account the significant consequences of the parasitic capacitance. As a result, the effective channel length and the overlap length measured using the conventional method may have low reliability.

SUMMARY OF THE INVENTION

Provided is a method of accurately and reliably measuring an effective channel length and an overlap length having physical significances in a super minute MOSFET.

In accordance with one aspect of the present disclosure, provided is a method of measuring an effective channel length and an overlap length, wherein a first MOSFET, a second MOSFET and a third MOSFET are formed on a substrate. Here, the first MOSFET includes a first gate pattern that has a first length and a first effective width. The second MOSFET includes a second gate pattern that has the first length and a second effective width different from the first effective width. The third MOSFET includes a third gate pattern that has a second length different from the first length and a third effective width. A parasitic capacitance between the first, second and third gate patterns and the substrate in the first, second and third MOSFETs is determined based on first and second capacitances, which are measured by applying a first voltage between the first and second gate patterns and the substrate. A second voltage is applied between the first gate pattern and the substrate in the first MOSFET and a third voltage between the third gate pattern and the substrate in the third MOSFET to measure a preliminary third capacitance and a preliminary fourth capacitance. Third and fourth capacitances are determined by excluding the parasitic capacitance from the preliminary third and fourth capacitances. Overlap lengths of the first, second and third gate patterns are determined based on the third and fourth capacitances. Effective channel lengths of the first, second and third gate patterns are then determined based on the overlap length.

Determining the parasitic capacitance can include applying the first voltage between the first gate pattern and the substrate with a source/drain of the first MOSFET grounded and measuring the first capacitance; and applying the first voltage between the second gate pattern and the substrate with a source/drain of the second MOSFET grounded and measuring the second capacitance. When the effective widths of the first, second and third gate patterns are approximately zero, the parasitic capacitance is calculated based on the first and second capacitances, the first and second capacitances corresponding to a difference between the first effective width of the first gate pattern and the second effective width of the second gate pattern.

Second and third voltages can be determined when carriers reach junction boundaries of the first and third MOSFETs, respectively.

Determining the second voltage can comprise measuring capacitances at a plurality of voltages by sweeping voltages between the first gate pattern and the substrate with the source/drain of the first MOSFET grounded. The parasitic capacitance can be removed from the measured capacitance to determine actual capacitances excluding the parasitic capacitance. The capacitances excluding the parasitic capacitance can be differentiated to obtain differentiated capacitances. A maximum absolute value of the differentiated capacitances can be designated as the second voltage.

Determining the third voltage, can comprise measuring capacitances at a plurality of voltages by sweeping voltages between the third gate pattern and the substrate with the source/drain of the third MOSFET grounded. The parasitic capacitance can be removed from the measured capacitance to determine actual capacitances excluding the parasitic capacitance. The capacitances excluding the parasitic capacitance can be differentiated to obtain differentiated capacitances. A maximum absolute value of the differentiated capacitances can be designated as the third voltage.

When the third effective width is substantially the same as the first effective width, obtaining the third and fourth capacitances can include applying the second voltage between the first gate pattern and the substrate with the source/drain of the first MOSFET grounded and measuring the preliminary third capacitance. The parasitic capacitance can be subtracted from the preliminary third capacitance to determine the third capacitance. The method can also include applying the third voltage between the third gate pattern and the substrate with the source/drain of the third MOSFET grounded and measuring the preliminary fourth capacitance. The parasitic capacitance can then be subtracted from the preliminary fourth capacitance to obtain the fourth capacitance.

In contrast, when the third effective width is different from the first effective width, obtaining the third and fourth capacitances can include applying the second voltage between the first gate pattern and the substrate with the source/drain of the first MOSFET grounded and measuring the preliminary third capacitance. The parasitic capacitance can then be subtracted from the preliminary third capacitance to determine the third capacitance. The method also includes applying the third voltage between the third gate pattern and the substrate with the source/drain of the third MOSFET grounded and measuring a primary preliminary fourth capacitance. A secondary preliminary fourth capacitance, when the third effective width of the third MOSFET is a fraction of the first effective width, can be calculated based on the primary preliminary fourth capacitance. The parasitic capacitance can then be subtracted from the secondary preliminary fourth capacitance to obtain the fourth capacitance.

Determining the overlap length can include calculating a gate length, when capacitances between the first, second and third gate patterns and the substrate in the MOSFETs are approximately zero, based on the third and fourth capacitances corresponding to a length difference between the first gate pattern and the third gate pattern. The gate length is then multiplied by ½ to obtain the overlap length.

Further, the effective channel length is calculated from an equation Lgate+$X_L$−2Lov. The Lgate represents a length of the gate pattern, the $X_L$ indicates an offset factor generated in a process for forming the gate pattern, and the Lov is the overlap length.

Each of the first, second and third gate patterns can include gate fingers that each have substantially the same widths and are arranged in parallel with each other, and in each of the first, second and third gate patterns the gate fingers comprise ends connected to each other.

The gate fingers of the first gate pattern can have a length substantially the same as that of the gate fingers of the second gate pattern, and the number of gate fingers in the first gate pattern can be different from the number of gate fingers in the second gate pattern.

The first, second and third MOSFETs can be formed having substantially the same gate oxide layers, gate electrode materials, thicknesses of the gate oxide layer, thicknesses of the gate electrode, substrates, and impurity conditions in the source/drain.

In accordance with another aspect of the present disclosure, provided is a method of measuring an effective channel length and an overlap length in a MOSFET, wherein a first MOSFET, a second MOSFET and a third MOSFET are formed on a substrate. Here, the first MOSFET includes a first gate pattern that has N number of gate fingers having a first length and a first width. The second MOSFET includes a second gate pattern that has M number of gate fingers having the first length and the first width. The third MOSFET includes a third gate pattern that has L number of gate fingers having a second length and the first width. A parasitic capacitance between the first, second and third gate patterns and the substrate in the first, second and third MOSFETs can be determined based on the first and second capacitances, which are measured by applying a first voltage between the first and second gate patterns and the substrate and a capacitance obtained when the number of the gate fingers is approximately zero. Voltages obtained when carriers reach junction boundaries of the first and third MOSFETs are designated as the second and third voltages, respectively. The method also includes applying the second voltage between the first gate pattern and the substrate in the first MOSFET and the third voltage between the third gate pattern and the substrate in the third MOSFET and measuring a preliminary third capacitance and a preliminary fourth capacitance. A third capacitance and a fourth capacitance are determined by excluding the parasitic capacitance from the preliminary third and fourth capacitances, respectively. A gate length, when capacitances between the first, second and third gate patterns and the substrate are approximately zero, is calculated based on the third and fourth capacitances. The gate length is multiplied by ½ to obtain an overlap length. Effective channel lengths of the first, second and third gate patterns are obtained based on the overlap length.

Determining the second voltage can comprise sweeping voltages between the first gate pattern and the substrate with the source/drain of the first MOSFET grounded and measuring capacitances relating to each of the voltages. The method can further include removing the parasitic capacitance from the measured capacitance to determine actual capacitances by excluding the parasitic capacitance. And the method can include differentiating the capacitances (excluding the parasitic capacitance) to obtain differentiated capacitances and determining a maximum absolute value of the differentiated capacitances as the second voltage.

Determining the third voltage can comprise sweeping voltages between the third gate pattern and the substrate with the source/drain of the third MOSFET grounded and measuring capacitances related to each of the voltages. The method can further include removing the parasitic capacitance from the measured capacitance to determine actual capacitances excluding the parasitic capacitance. And the method can include differentiating the capacitances excluding the parasitic capacitance to obtain differentiated capacitances and determining a maximum absolute value of the differentiated capacitances as the third voltage.

The number of the gate fingers in the first MOSFET can be substantially the same as that of the gate fingers in the third MOSFET, wherein determining the third and fourth capacitances can comprise applying the second voltage between the first gate pattern and the substrate with the source/drain of the first MOSFET grounded and measuring the preliminary third capacitance and subtracting the parasitic capacitance from the preliminary third capacitance to obtain the third capacitance. The method can also include applying the third voltage between the third gate pattern and the substrate with the source/drain of the third MOSFET grounded and measuring the preliminary fourth capacitance and subtracting the parasitic capacitance from the preliminary fourth capacitance to obtain the fourth capacitance.

The number of the gate fingers in the first MOSFET can be different from that of the gate fingers in the third MOSFET, wherein obtaining the third and fourth capacitances can comprise applying the second voltage between the first gate pattern and the substrate with the source/drain of the first MOSFET grounded and measuring the preliminary third capacitance and subtracting the parasitic capacitance from the preliminary third capacitance to obtain the third capacitance. The method can further include applying the third voltage between the third gate pattern and the substrate with the source/drain of the third MOSFET grounded and measuring a primary preliminary fourth capacitance and calculating a secondary preliminary fourth capacitance, when the third effective width of the third MOSFET is a fraction of the first effective width, based on the primary preliminary fourth capacitance. The method can also include subtracting the parasitic capacitance from the secondary preliminary fourth capacitance to obtain the fourth capacitance.

The effective channel length can be calculated from an equation: $L_{gate}+X_L-2L_{ov}$. The Lgate represents a length of the gate pattern, the $X_L$ indicates an offset factor generated in a process for forming the gate pattern, and the Lov is the overlap length.

According to one example embodiment, determining the parasitic capacitance includes plotting the first and second capacitances by the number of gate fingers on a graph of which an X-axis represents the number of the gate fingers and a Y-axis represents a voltage between the gate patterns and the substrate. A straight line is drawn using the graphed points representing the first and second capacitances. A capacitance where the straight line intersects with the Y-axis is then determined as the parasite capacitance.

Calculating the gate length can include plotting the first and second capacitances by the gate length on a graph of which an X-axis represents the gate length and a Y-axis represents a capacitance between the gate patterns and the substrate, excluding the parasitic capacitance. A straight line is drawn using the plotted first and second capacitances. The gate length is determined where the straight line intersects with the X-axis.

According to the present invention, since the real capacitance between the gate and the bulk substrate excluding the parasitic capacitance in the super minute MOSFET is used, the effective channel length and the overlap length may be accurately obtained.

Further, since the effective channel length and the overlap length are obtained using the voltage obtained when the carriers reach the junction boundary of the source/drain, the effective channel length and the overlap length may have physical significances.

BRIEF DESCRIPTION OF THE DRAWINGS

Various aspects of the invention will become more apparent in view of the attached drawing figures, which are provided by way of example, not by way of limitation, in which.

DESCRIPTION OF THE EMBODIMENTS

Figure 1:
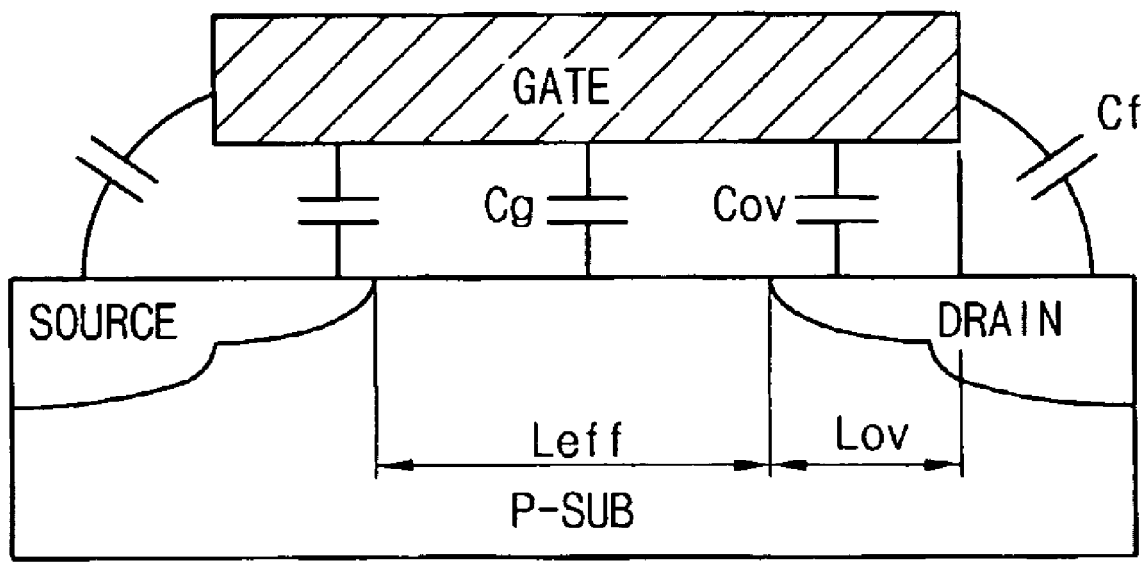
FIG. 1 is a cross-sectional view illustrating capacitor parameters in a super minute MOSFET.

The accompanying drawings are described below, in which example embodiments in accordance with aspects of the present invention are shown. This invention can, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that, although the terms first, second, etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, can be used herein for ease of description to describe one element or feature's relationship to another one or more element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprise," "comprises," "comprising," "include," "includes" and/or "including," when used in this specification and/or claims, specify the presence of stated features, integers, steps, operations, elements, and/or components, but do not preclude the presence or addition of one or more other features, integers, steps, operations, elements, components, and/or groups thereof.

FIG. 1 is a cross-sectional view illustrating capacitor parameters in a super minute MOSFET. Referring to FIG. 1, an entire capacitance in a MOSFET is a sum of a capacitance Cg between a gate and a channel, a capacitance Cov between the gate and an overlap source/drain, and a peripheral capacitance Cf between the gate and the source/drain. Hereinafter, an embodiment of a method of measuring an effective channel length and an overlap length using the above-mentioned capacitor parameters of the MOSFET is illustrated in detail.

Figure 2:
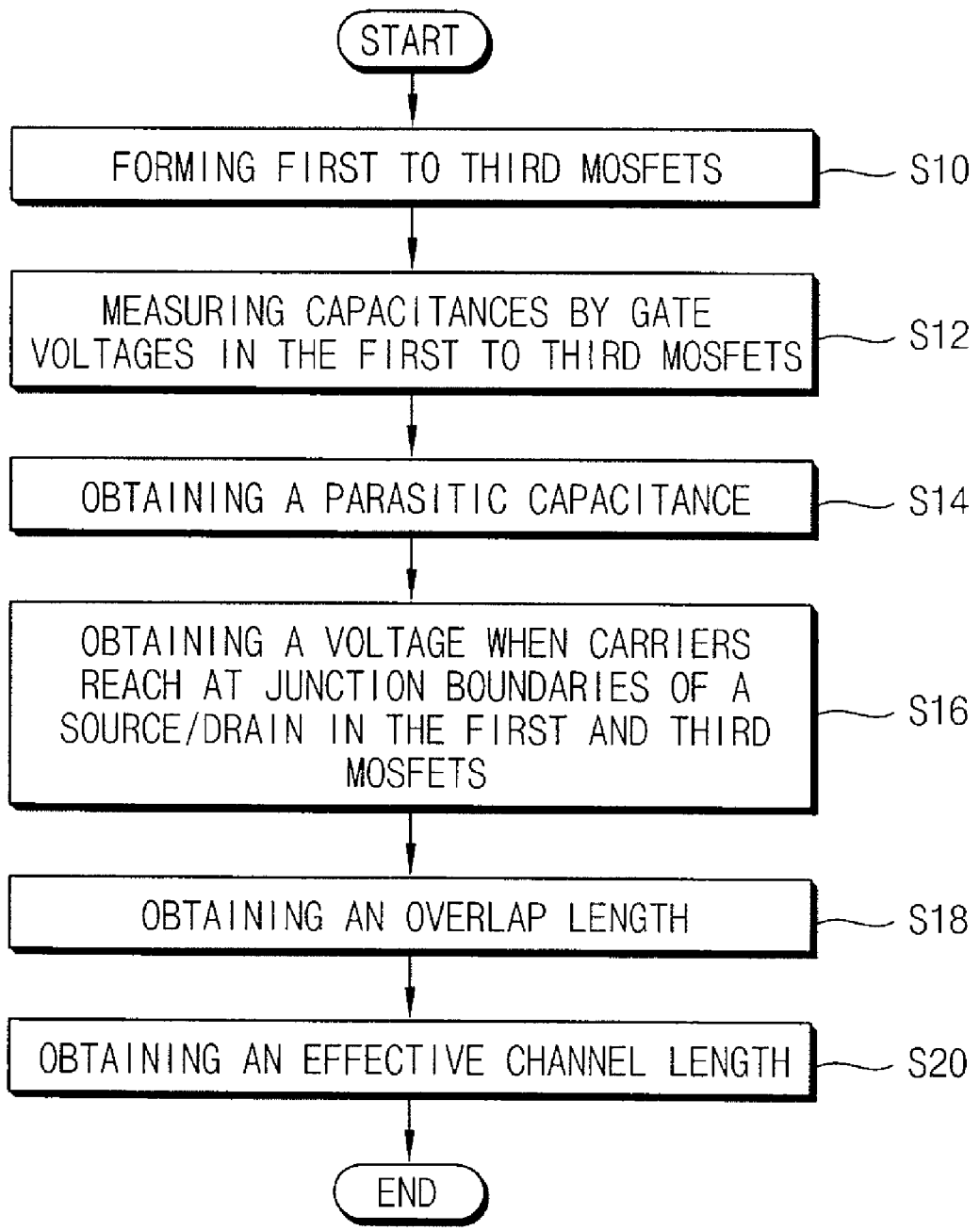
FIG. 2 is a flow chart illustrating a first example embodiment of a method of measuring an effective channel length (Leff) and an overlap length (Lov) in the super minute MOSFET, in accordance with aspects of the present invention.

FIG. 2 is a flow chart illustrating a method of measuring an effective channel length Leff and an overlap length Lov in the super minute MOSFET in accordance with a first example embodiment of the present invention, such as the MOSFET of FIG. 1.

Referring to FIG. 2 in step S10, first, second and third MOSFETs are formed on a bulk substrate doped with impurities. Here, the first, second and third MOSFETs include different gates and different source/drains. The first, second and third MOSFETs are samples that are used for measuring an effective channel length Leff and an overlap length Lov. Gate oxide layers, materials of gate electrodes, thicknesses of the gate oxide layers, thicknesses of the gate electrodes, the bulk substrates and impurity conditions of the source/drains in the first, second and third MOSFET are substantially the same. In contrast, lengths and effective widths of gate patterns in the first, second and third MOSFETs are different from one another.

Hereinafter, the gate patterns in the first, second and third MOSFETs, which have configurations suitable for measuring the effective channel length Leff and the overlap length Lov, are illustrated in detail.

Figure 3A:
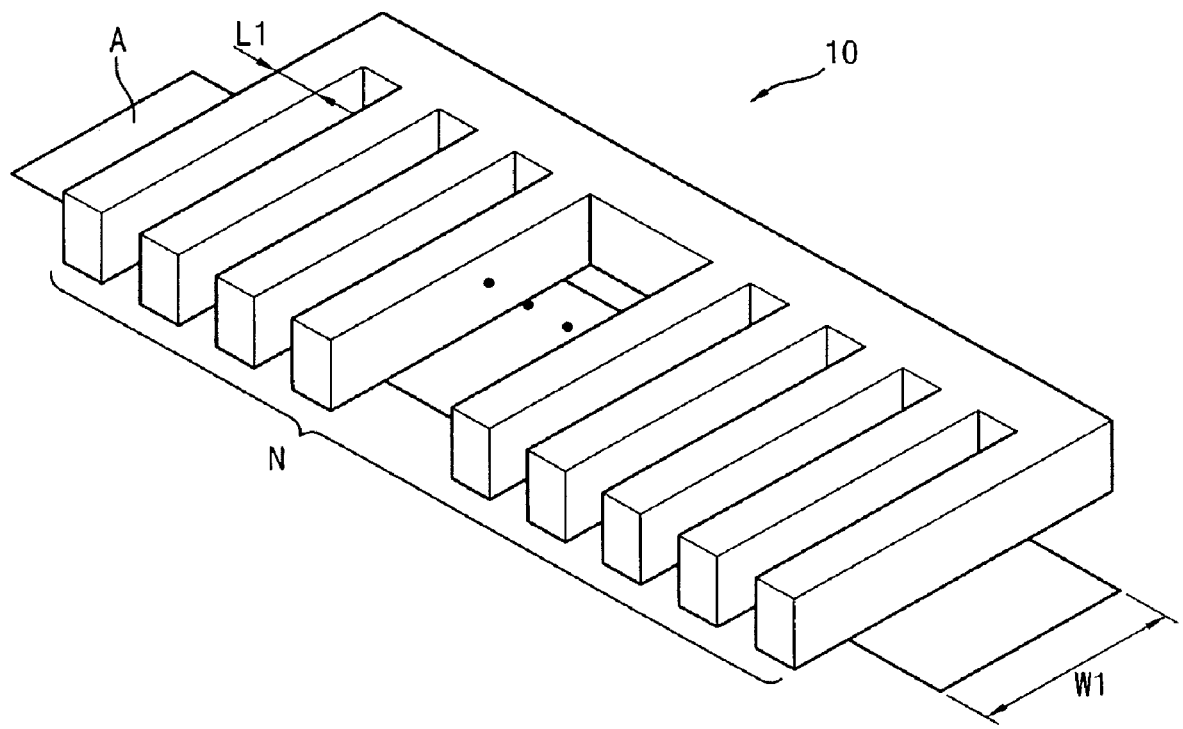
FIG. 3A is a perspective view illustrating an example embodiment of a first gate pattern in accordance with aspects of the present invention.
Figure 3B:
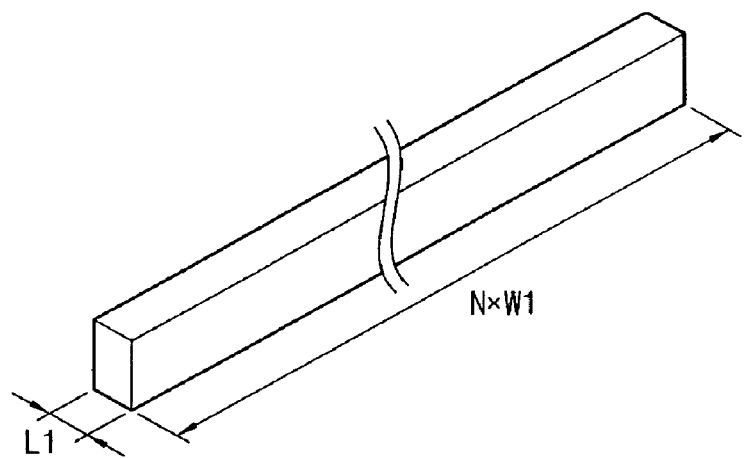
FIG. 3B is a perspective view illustrating an example embodiment of a pattern that has a function substantially the same as that of the first gate pattern in FIG. 3A.
Figure 4A:
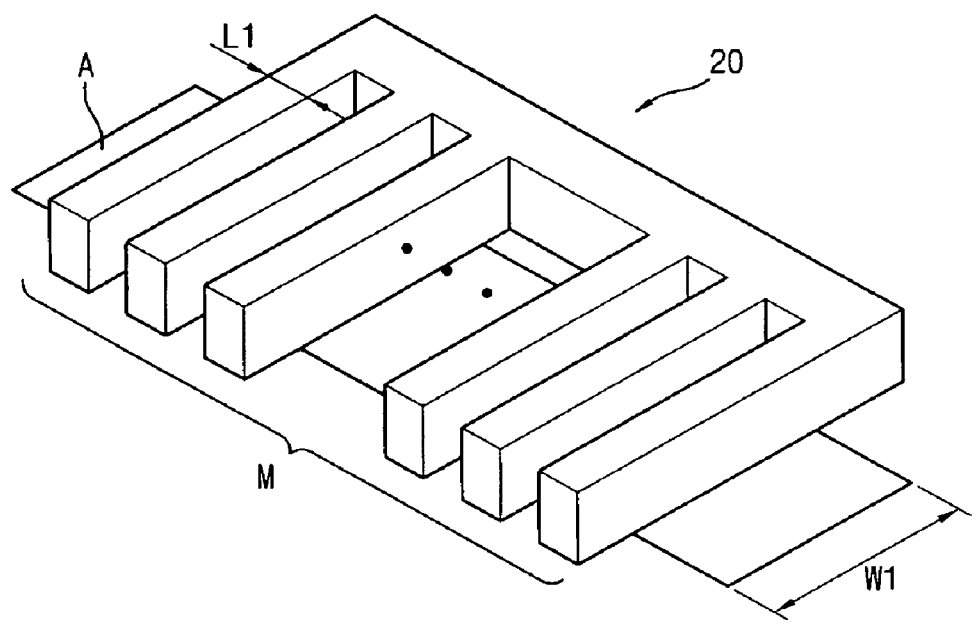
FIG. 4A is a perspective view illustrating an example embodiment of a second gate pattern in accordance with aspects of the present invention.
Figure 4B:
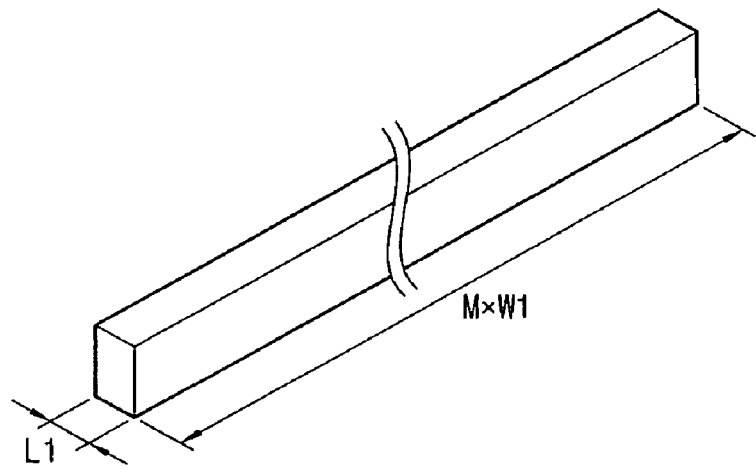
FIG. 4B is a perspective view illustrating an embodiment of a pattern that has a function substantially the same as that of the second gate pattern in FIG. 4A.
Figure 5A:
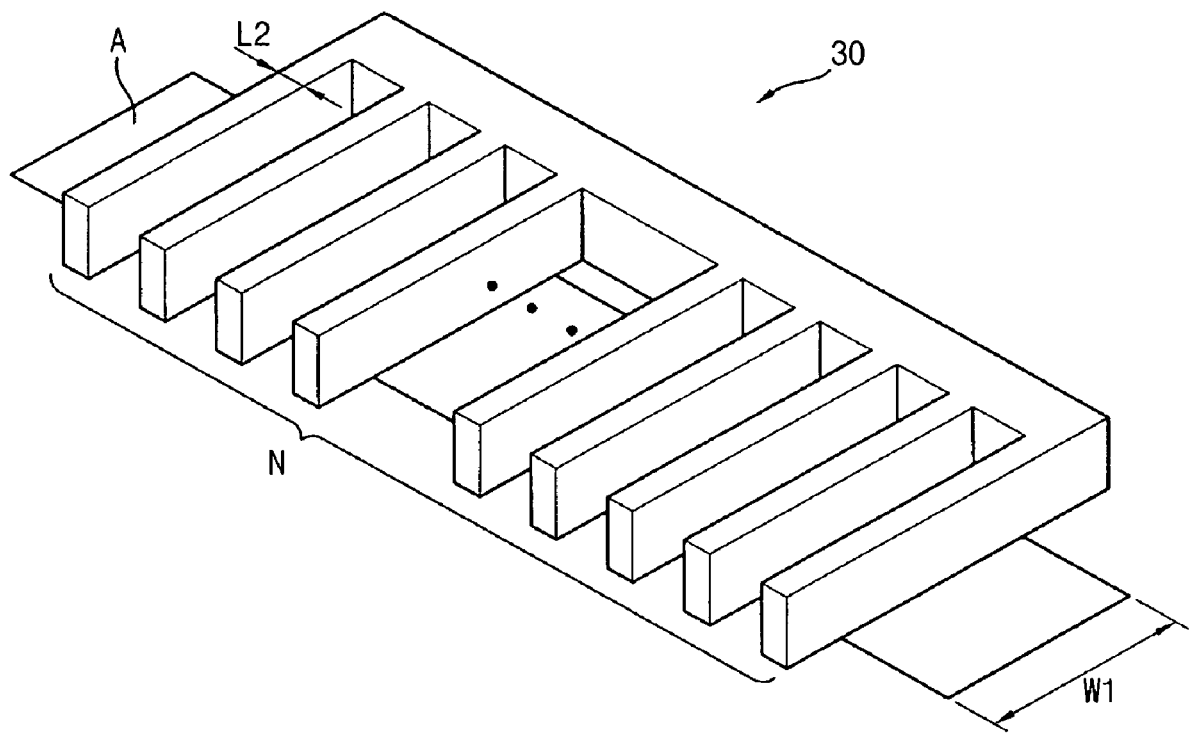
FIG. 5A is a perspective view illustrating an embodiment of a third gate pattern in accordance with aspects of the present invention.
Figure 5B:
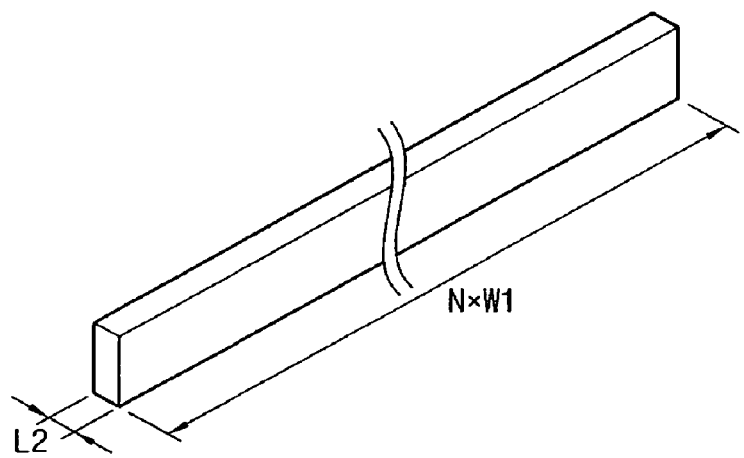
FIG. 5B is a perspective view illustrating an embodiment of a pattern that has a function substantially the same as that of the third gate pattern in FIG. 5A.

FIG. 3A is a perspective view illustrating a first gate pattern, FIG. 4A is a perspective view illustrating a second gate pattern, and FIG. 5A is a perspective view illustrating a third gate pattern. Further, FIG. 3B is a perspective view illustrating a pattern that has a function substantially the same as that of the first gate pattern in FIG. 3A, FIG. 4B is a perspective view illustrating a pattern that has a function substantially the same as that of the second gate pattern in FIG. 4A, and FIG. 5B is a perspective view illustrating a pattern that has a function substantially the same as that of the third gate pattern in FIG. 5A.

Referring to FIG. 3A, a first gate pattern 10 in the first MOSFET is positioned on an active region A of a bulk substrate. Further, the first gate pattern 10 includes N number of gate fingers. Each of the N number of gate fingers has a first length L1 and a first width W1. Furthermore, ends of the gate fingers are connected to each other. Here, the first length L1 is a lengthwise direction of the gate finger along a channel direction of the first gate pattern 10. The first width W1 is a width of a portion of the gate finger overlapped with the active region A.

When the first gate pattern 10 is formed by the N number of gate fingers having the first width W1, the first MOSFET has an effective width of the first width W1×N. That is, the first MOSFET in FIG. 3A has a function substantially the same as that of a MOSFET in FIG. 3B. However, the MOSFET in FIG. 3B can occupy a large area of the bulk substrate. Further, it can be difficult to accurately measure a capacitance of the MOSFET in FIG. 3B. Therefore, in this example embodiment, the first MOSFET includes the first gate pattern 10 having the gate fingers in FIG. 3A.

Referring to FIG. 4A, a second gate pattern 20 in the second MOSFET is positioned on the active region A of the bulk substrate. Further, the second gate pattern 20 includes M number of gate fingers. Each of the M number of gate fingers has the first length L1 and the first width W1. Furthermore, ends of the gate fingers are connected to each other.

When the second gate pattern 20 is formed by the M number of gate fingers having the first width W1, the second MOSFET has an effective width of the first width W1×M. That is, the second MOSFET in FIG. 4A has a function substantially the same as that of a MOSFET in FIG. 4B. Thus, the second MOSFET has a function substantially the same as that of the first MOSFET except for the effective width.

Referring to FIG. 5A, a third gate pattern 30 in the third MOSFET is positioned on the active region A of the bulk substrate. Further, the third gate pattern 30 includes N number of gate fingers. Each of the N number of gate fingers has a second length L2 and the first width W1. Furthermore, ends of the gate fingers are connected to each other.

When the third gate pattern 30 is formed by the N number of gate fingers having the first width W1, the third MOSFET has an effective width of the first width W1×N. That is, the third MOSFET in FIG. 5A has a function substantially the same as that of a MOSFET in FIG. 5B. Thus, the third MOSFET has a function substantially the same as that of the first MOSFET except for the length along the channel direction of the gate.

Hereinafter, in this example embodiment, the first gate pattern 10 of the first MOSFET has a length of 1 μm and a width of 10 μm. Further, the number NF of the gate fingers in the first gate pattern 10 is 200. The second gate pattern 20 of the second MOSFET has a length of 1 μm and a width of 10 μm. Further, the number $N_F$ of the gate fingers in the second gate pattern 20 is 100. The third gate pattern 30 of the third MOSFET has a length of 0.136 μm and a width of 10 μm. Further, the number $N_F$ of the gate fingers in the third gate pattern 30 is 200.

In the MOSFETs, a capacitance Cgb between the gate and the bulk substrate is measured. The measured capacitance Cgb is represented as following Equation 1.

$$Cgb = Cox \times [Lgate + X_L - 2Lov] \times W \times N_F + Cp \qquad \text{Equation 1}$$

In Equation 1, the Cox represents a capacitance ($\epsilon/d$), the Lgate indicates a length along the channel direction of the gate, the $X_L$ represents an offset of the Lgate, Lov indicates an overlap length, W represents a width of the gate finger, the $N_F$ indicates the number of the gate finger, and Cp represents a parasitic capacitance. That is, the measured Cgb corresponds to the parasitic capacitance added to a value that is the Cox multiplied by an effective area.

Returning to FIG. 2, in step S12, in the first, second and third MOSFETs, various voltages are continuously applied between the gate and the bulk substrate to measure capacitances in accordance with each of the applied voltages. The above-mentioned process, which means that the various voltages or currents are applied, is referred to as a sweep.

Hereinafter, a method of measuring capacitances in accordance with applied voltages is illustrated in detail.

Figure 6:
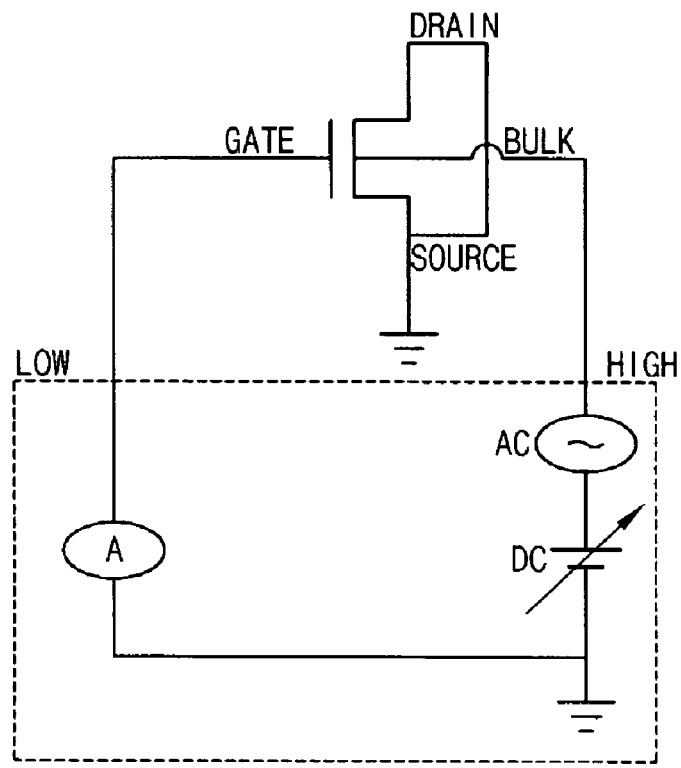
FIG. 6 is an embodiment of a circuit diagram that is used for measuring a capacitance between a gate and a bulk substrate using the first, second and third gate patterns of FIGS. 3A, 4A and 5A.

FIG. 6 is a circuit diagram that is used for measuring a capacitance between the gate and the bulk substrate in the first, second and third MOSFETs. Referring to FIG. 6, direct currents (DC) are swept between the gate pattern and the bulk substrate with the source/drain being grounded. Further, alternating currents (AC) are also applied between the gate pattern and the bulk substrate. The capacitances Cgb between the gate pattern and the bulk substrate are measured with each of the swept DCs.

In step S14 of FIG. 2, the first voltage is applied to the gates and the bulk substrate in the first and second MOSFETs to measure the first and second capacitances. A parasitic capacitance in the first, second and third MOSFETs is measured based on the measured first and second capacitances.

Hereinafter, a method of measuring the parasitic capacitance is illustrated in detail.

The first voltage is applied between the gate and the bulk substrate in the first MOSFET to measure the first capacitance. In this example embodiment, a capacitance measured under a condition that the first voltage is about 0V is used as the first capacitance.

The first voltage is also applied between the gate and the bulk substrate in the second MOSFET to measure the second capacitance. In this example embodiment, since the first voltage is about 0V in the first MOSFET, a capacitance measured under a condition that the first voltage is about 0V is used as the second capacitance in the second MOSFET.

Figure 8:
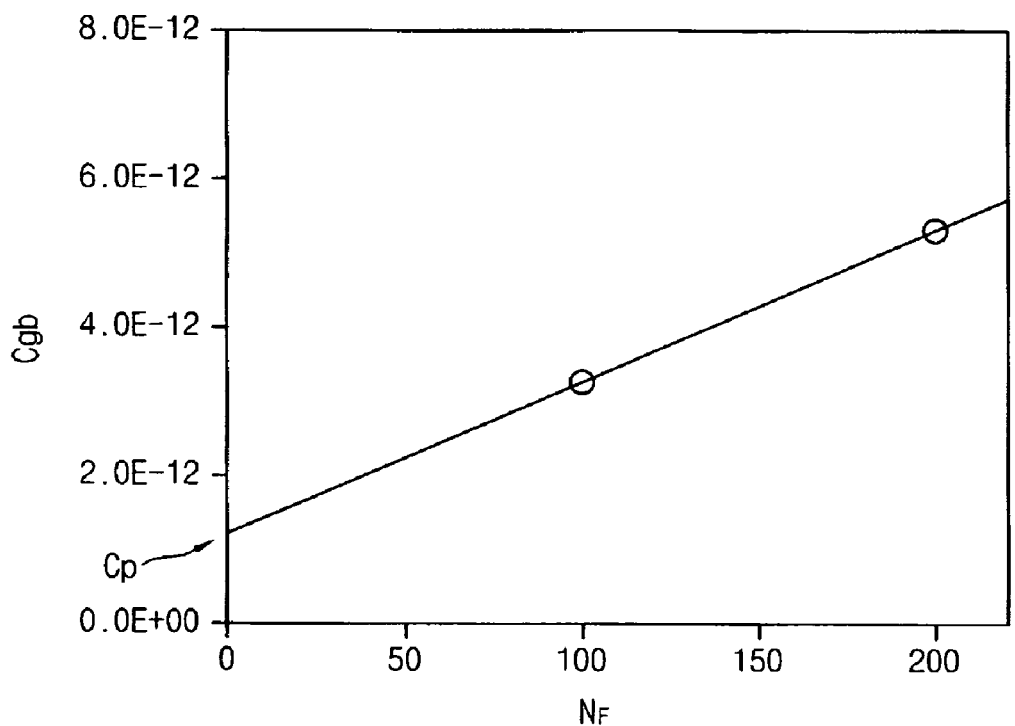
FIG. 8 is a graph used for measuring a parasitic capacitance, in accordance with aspects of the present invention.

FIG. 8 is a graph that is used for measuring a parasitic capacitance. In the graph on FIG. 8, a horizontal X-axis represents the number of the gate fingers, and a vertical Y-axis indicates the measured Cgb. The measured Cgb is plotted against the number of the gate finger (e.g., N and M in FIGS. 3A, 4A, and 5A). The two plotted points in FIG. 8 represent measured Cgb for each number of gate fingers used in the corresponding example embodiments. These points are connected to each other with a straight line to approximately obtain the Cgb when the number of the gate fingers is zero. Here, when the number of the gate fingers is zero this means that the effective width of the gate is zero. Thus, a capacitance measured under the condition that the effective width of the gate is zero corresponds to the parasitic capacitance Cp, which falls on the Y-axis. In this example embodiment, Cp is approximated to be about 1.2E-12F, as shown in FIG. 8. As illustrated above, the Cp is obtained based on the first and second MOSFETs having the different effective widths. In this example embodiment, the Cp is determined under the condition that the first voltage is about 0V. Alternatively, the first voltage may not be restricted to 0V. Thus, the Cp may be obtained using other voltages.

The effective channel length and the overlap length are obtained based on an actual capacitance Cgb determined by subtracting Cp from the measured Cgb. Therefore, the parasitic capacitance Cp is subtracted from the measured capacitance Cgb to determine a capacitance related to voltage in the first, second and third MOSFETs, excluding the parasitic capacitance (hereinafter, referred to as a "Cgb-Cp").

Figure 7:
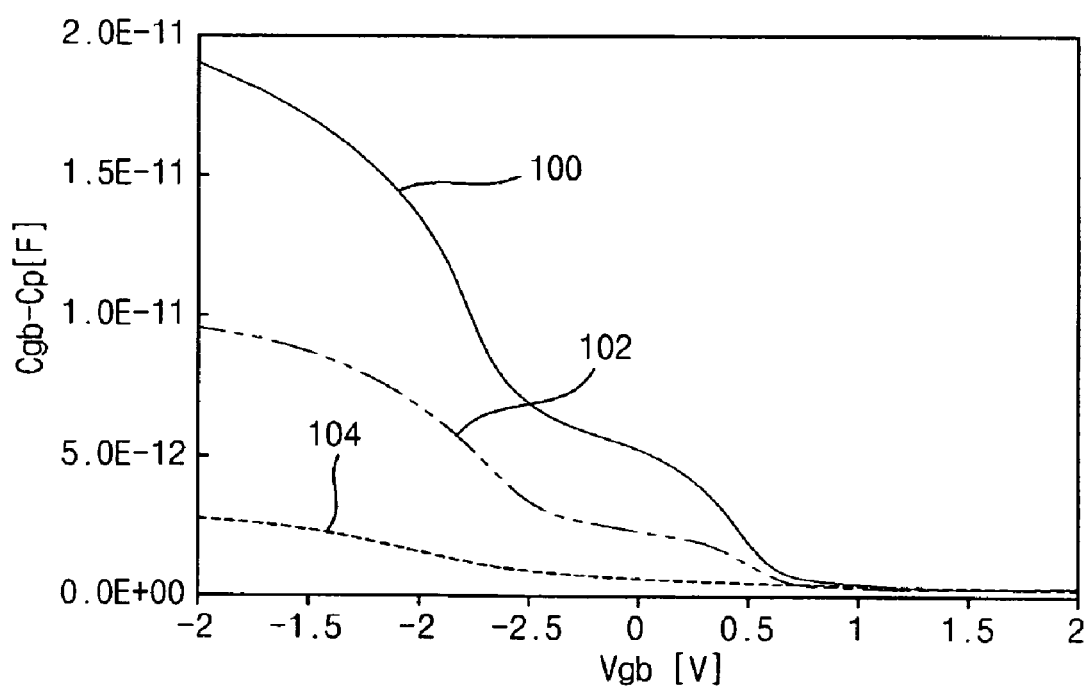
FIG. 7 is a graph illustrating measured capacitances relative to voltages between gate patterns and the bulk substrate using the first, second and third gate patterns of FIGS. 3A, 4A and 5A.

FIG. 7 is a graph illustrating measured capacitances having the Cp subtracted from the measured Cgb, in accordance with the voltages between gate patterns and the bulk substrate in the first, second and third MOSFETs.

In FIG. 7, a reference numeral 100 indicates a Cgb-Cp in the first MOSFET of FIG. 3A, a reference numeral 102 represents a Cgb-Cp in the second MOSFET of FIG. 4A, and a reference numeral 104 indicates a Cgb-Cp in the third MOSFET of FIG. 5A.

In step S16 of FIG. 2, to measure the effective channel length and the overlap length in the first, second and third MOSFET, the second and third voltages between the gate and the bulk substrate are used. Here, the effective channel length and the overlap length vary, as do the voltages between the gate and the bulk substrate. Thus, the effective channel length and the overlap length may be measured using a voltage having physical significance, which can also be used as a standard voltage.

In this example embodiment, the second and third voltages are determined as voltages at which a plurality of carriers reaches a junction boundary of the source/drain in the first and third MOSFETs.

Figure 11:
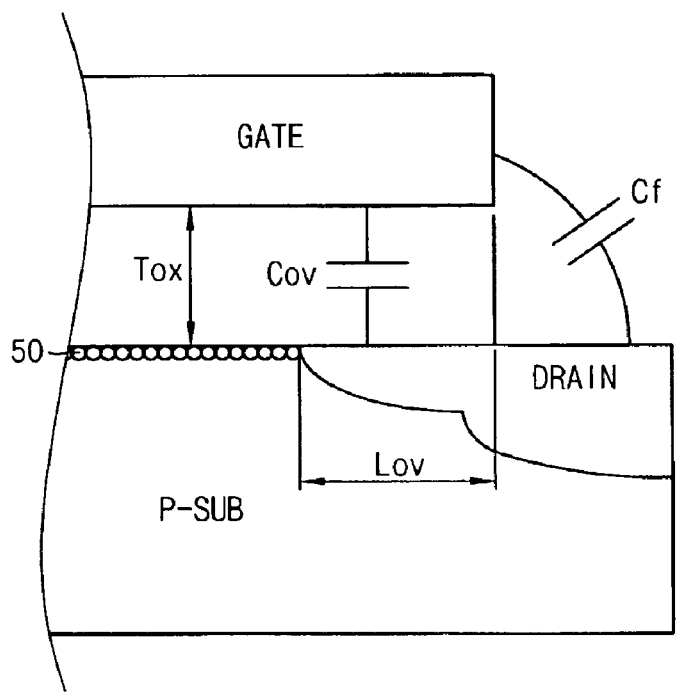
FIG. 11 is a cross-sectional view illustrating a MOSFET in which a plurality of carriers reaches at a junction boundary of a source/drain, in accordance with aspects of the present invention.

FIG. 11 is a cross-sectional view illustrating a MOSFET in which a plurality of carriers reaches a junction boundary of a source/drain. Referring to FIG. 11, when the carriers 50 reach the junction boundary of the drain region (known as a "metallurgical junction") in the MOSFET, the capacitance is abruptly changed, because impurities in the channel region and the drain region are different from each other. The same is true at the junction boundary of the source region (not shown). Therefore, voltages between the gate and the bulk substrate when the capacitance between the gate and the bulk substrate is abruptly changed are designated as the second and third voltages.

Hereinafter, a method of determining the second and third voltages is illustrated in detail.

Figure 9:
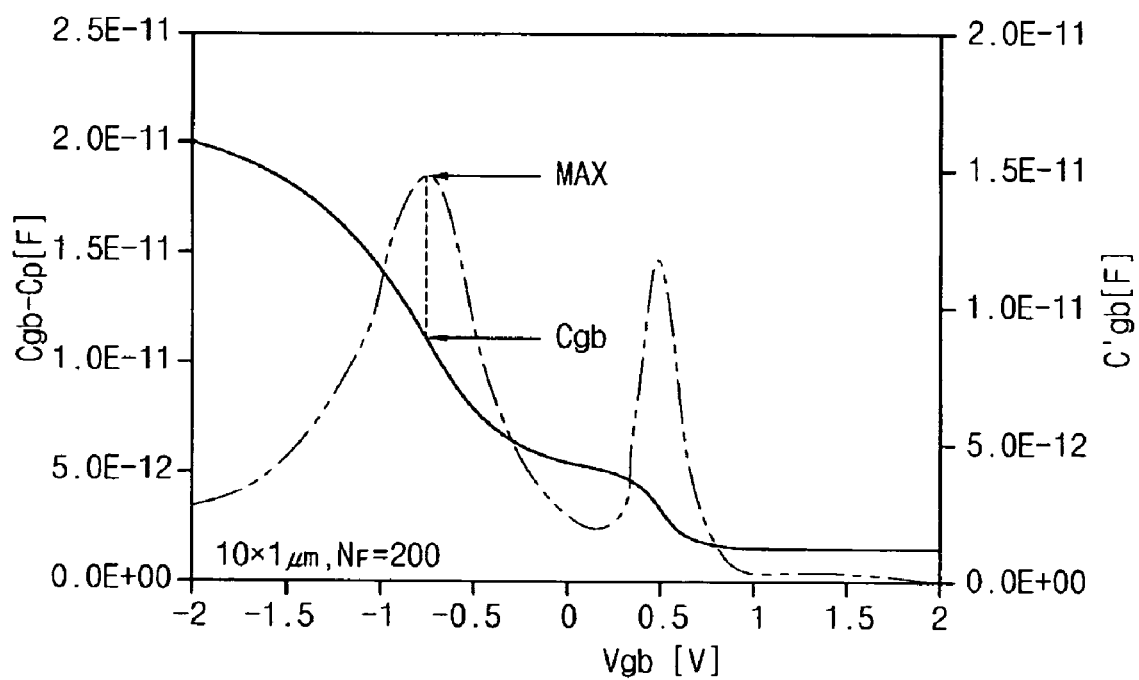
FIG. 9 is a graph used for determining a second voltage, in accordance with aspects of the present invention.
Figure 10:
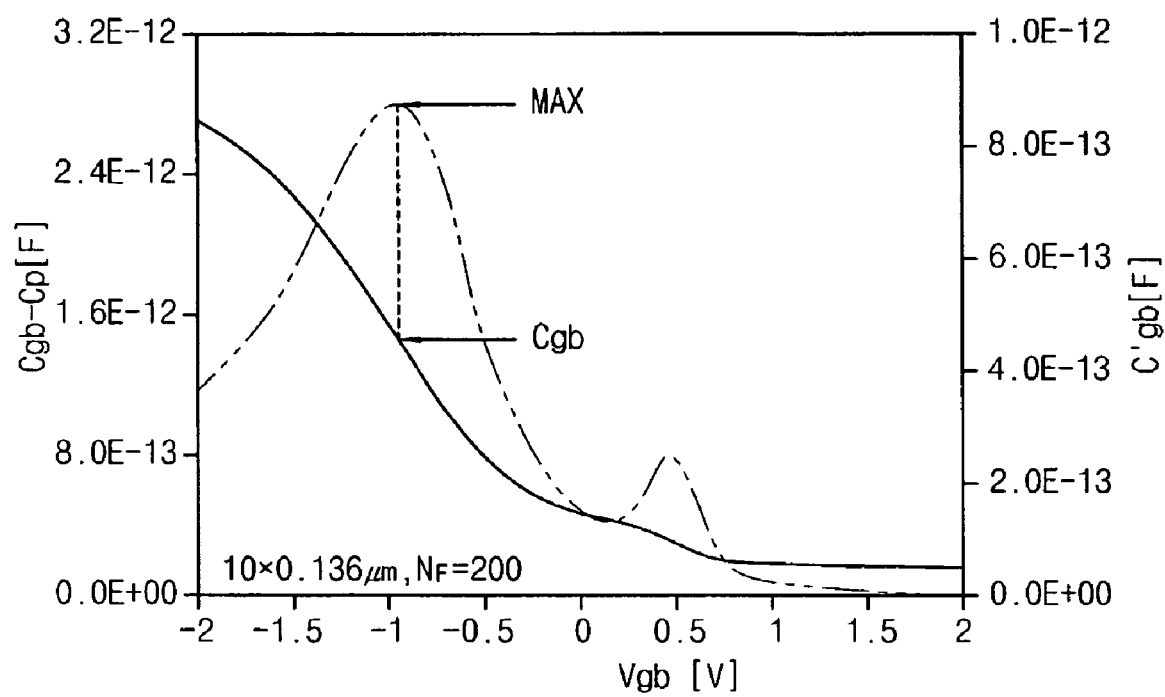
FIG. 10 is a graph used for determining a third voltage, in accordance with aspects of the present invention.

FIG. 9 is a graph that can be used for determining a second voltage and FIG. 10 is a graph that is used for determining a third voltage. Particularly, in FIG. 9, the parasitic capacitance Cp is subtracted from the measured capacitance Cgb at the voltages applied to the first MOSFET to determine a capacitance at those voltages that excludes the parasitic capacitance (again, referred to as a "Cgb-Cp"). To determine the second voltage, the calculated values of Cgb-Cps are plotted against the voltages applied between the gate and the bulk substrate. This plot is represented by the solid line shown in FIG. 9.

The Cgb-Cps are differentiated to obtain differentiated capacitances C'gb1. Absolute values of the differentiated capacitances C'gb1 are also plotted against the voltages. This plot is represented by the dashed line shown in FIG. 9. Here, when a voltage corresponding to a maximum absolute value of the differentiated capacitance is applied, the capacitance between the gate and the bulk substrate is most abruptly changed. Thus, the voltage corresponding to the maximum absolute value of the differentiated capacitance is designated as the second voltage. Thus, in FIG. 9, the voltage from the X-axis corresponding to the "MAX" point is the second voltage.

The third voltage is determined using the method of determining the second voltage, discussed above. Particularly, the parasitic capacitance Cp is subtracted from the measured capacitance Cgb at the voltages applied in the third MOSFET to determine a capacitance at those voltages that excludes the parasitic capacitance (again, referred to as a "Cgb-Cp"). To determine the third voltage, the calculated values of Cgb-Cps are plotted against the voltages applied between the gate and the bulk substrate, as shown in FIG. 10.

The Cgb-Cps are differentiated to obtain differentiated capacitances C'gb1. Absolute values of the differentiated capacitances C'gb1 are plotted against the voltages shown in FIG. 10. A voltage corresponding to a maximum absolute value of the differentiated capacitance is designated as the third voltage. Thus, in FIG. 10, the voltage from the X-axis corresponding to the "MAX" point is the third voltage.

When the second and third voltages are applied between the gate and the bulk substrate, the first and third MOSFETs output the third and fourth capacitances excluding the parasitic capacitances, respectively.

Particularly as shown in FIG. 9, when the second voltage is applied, the first MOSFET outputs the third capacitance of about 1.1E-11F, indicated by the Cgb point on the solid line plot. Further, as shown in FIG. 10, when the third voltage is applied, the third MOSFET outputs the fourth capacitance of about 1.2E-12F.

A gate length is calculated under a condition that the capacitance between the gate and the bulk substrate is approximately zero based on the third and fourth capacitances in accordance with a length difference between the first and third gate patterns. A half of the calculated gate length is obtained as the overlap length.

Hereinafter, a method of measuring the overlap length is illustrated in detail.

Figure 12:
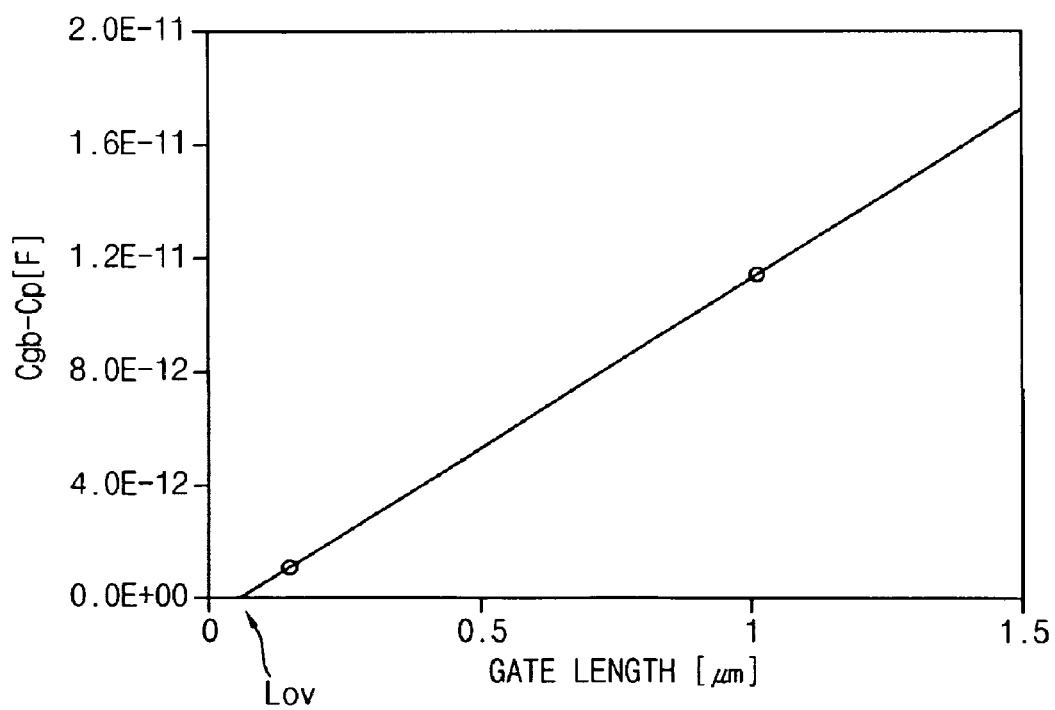
FIG. 12 is a graph used for determining an overlap length, in accordance with aspects of the present invention.

FIG. 12 is a graph that can be used to determine an overlap length. In the graph on FIG. 12, an X-axis indicates the gate length, and a Y-axis represents the capacitance excluding the parasitic capacitance. Points indicating the third and fourth capacitances are plotted on the graph. Here, the first and third MOSFETs have different gate lengths and substantially the same effective widths. Thus, the plotted third and fourth capacitances Cgb-Cp are connected to each other using a straight line to determine the gate length when the Cgb-Cp is about 0F. Here, the Cgb-Cp having the value 0F means that a capacitance caused by a channel region is about zero. Therefore, only the overlap length is included in the gate length determined under the above-mentioned condition. As a result, since the gate length corresponds to an overlap length of the source/drain that is two times greater than the overlap length, the overlap length is about a half of the obtained gate length. In this example embodiment, the obtained overlap length is about 0.06 µm.

The effective channel lengths in the first, second and third gate patterns are obtained based on the overlap length. The effective channel length corresponds to the gate length subtracted by two times the overlap length, so that the effective channel length is represented as a following Equation 2.

$$Leff = Lgate + X_L - 2Lov \qquad \text{Equation 2}$$

In Equation 2, the Lgate indicates the length of the gate pattern, the $X_L$ represents an offset factor generated in a process for forming the gate pattern, and the Lov indicates the overlap length. Here, $Lgate+X_L$ in the first and second MOSFETs is about 1 µm and $Lgate+X_L$ in the third MOSFET is about 0.138 µm.

As describe above, according to the method of this example embodiment, the effective channel length and the overlap length in the super minute MOSFET may be accurately measured.

Hereinafter, a method of measuring an effective channel length Leff and an overlap length Lov in a super minute MOSFET in accordance with a second example embodiment of the present disclosure is illustrated.

The method of this example embodiment is substantially the same as that in the first example embodiment, except for a length and a effective width of a gate pattern in the MOSFET, and a process for creating a fourth capacitance that is used for obtaining an overlap length.

In this example embodiment, a first gate pattern in a first MOSFET includes N number of gate fingers having a first length L1 and a first width W1, as in FIG. 3A. A second gate pattern in a second MOSFET includes M number of gate fingers having the first length L1 and the first width W1, as in FIG. 4A. Further, a third gate pattern in a third MOSFET includes L number of gate fingers having a second length L2 and the first width W1, as in FIG. 5A. That is, the numbers of the gate fingers in the first, second and third MOSFETs are different from one another. As an example, when it is difficult to design the gate fingers in the third MOSFET substantially identical to those in the first MOSFET, the method of this example embodiment may be advantageously used.

A parasitic capacitance is obtained from the first and second MOSFETs using a manner substantially the same as that in the first embodiment. A voltage when carriers reach a junction boundary of a source/drain in the first and third MOSFETs is measured. Second and third voltages are applied between a gate and a bulk substrate in the first and third MOSFETs to measure capacitances between the gate and the bulk substrate.

The parasitic capacitance is removed from the capacitances measured in the first and third MOSFETs to determine third and fourth capacitances excluding the parasitic capacitance. Here, since the effective width of the third MOSFET is different from that of the first MOSFET, a process for obtaining the fourth capacitance is different from that in the first example embodiment.

Hereinafter, a process for obtaining the third and fourth capacitances is illustrated in detail.

The second voltage is applied between the first gate pattern and the bulk substrate with the source/drain of the first MOSFET being grounded to measure a preliminary third capacitance. The parasitic capacitance is subtracted from the preliminary third capacitance to obtain the actual third capacitance. That is, a process for obtaining the actual third capacitance in accordance with this example embodiment is substantially the same as that in the first embodiment.

The third voltage is applied between the third gate pattern and the bulk substrate with a source/drain of the third MOSFET being grounded to measure a primary preliminary fourth capacitance. A secondary preliminary fourth capacitance is calculated from the primary preliminary fourth capacitance when the third effective width of the third MOSFET is a fraction of the first effective width. The parasitic capacitance is subtracted from the secondary preliminary fourth capacitance to obtain the actual fourth capacitance. For example, when the third effective width is about a half of the first effective width, a value of the primary preliminary fourth capacitance multiplied by two corresponds to the fourth capacitance. That is, when the number of the gate fingers in the third MOSFET is about a half of that of the gate fingers in the first MOSFET, the value of the primary preliminary fourth capacitance multiplied by two is the fourth capacitance.

The overlap length and the effective channel length are obtained based on the third and fourth capacitances in a manner substantially the same as that in the first embodiment.

According to the present disclosure, since the actual capacitance between the gate and the bulk substrate, excluding the parasitic capacitance, in the super minute MOSFET is used, the effective channel length and the overlap length may be accurately obtained.

Further, since the effective channel length and the overlap length are obtained using the voltage obtained when the carriers reach the junction boundary of the source/drain, the effective channel length and the overlap length may have physical significances.

As a result, the method of the present disclosure may be advantageously employed in a design and manufacture of a super minute MOSFET having improved capacity.

The foregoing illustrative embodiments are not to be construed as limiting of the present invention. Although a few exemplary embodiments in accordance the invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses, if any, are intended to cover the structures described herein as performing the recited functions and structural and functional equivalents. Therefore, it is to be understood that the present invention is not to be construed as limited to the specific embodiments disclosed herein, and that modifications to the disclosed embodiments, as well as other embodiments, are intended to be included within the scope of the appended claims. The invention is defined by the following claims, with equivalents of the claims to be included therein.

What is claimed is:

1. A method of measuring an effective channel length and an overlap length in a MOSFET, comprising:
   forming a first MOSFET, a second MOSFET and a third MOSFET on a substrate, the first MOSFET including a first gate pattern that has a first length and a first effective width, the second MOSFET including a second gate pattern that has the first length and a second effective width different from the first effective width, and the third MOSFET including a third gate pattern that has a second length different from the first length and a third effective width;
   obtaining a parasitic capacitance between the first, second and third gate patterns and the substrate in the first, second, and third MOSFETs based on first and second capacitances, which are measured by applying a first voltage between the first and second gate patterns and the substrate;
   applying a second voltage between the first gate pattern and the substrate in the first MOSFET and a third voltage between the third gate pattern and the substrate in the third MOSFET to measure a preliminary third capacitance and a preliminary fourth capacitance;
   determining a third capacitance and a fourth capacitance by excluding the parasitic capacitance from the preliminary third capacitance and the preliminary fourth capacitance;
   determining overlap lengths of the first, second and third gate patterns based on the third and fourth capacitances; and
   determining effective channel lengths of the first, second and third gate patterns based on the overlap length.

2. The method of claim 1, wherein determining the parasitic capacitance comprises:
   applying the first voltage between the first gate pattern and the substrate with a source/drain of the first MOSFET grounded and measuring the first capacitance;
   applying the first voltage between the second gate pattern and the substrate with a source/drain of the second MOSFET grounded and measuring the second capacitance; and
   calculating the parasitic capacitance based on the first and second capacitances, when the effective widths of the first, second and third gate patterns are approximately zero, wherein the first and second capacitances correspond to a difference between the first effective width of the first gate pattern and the second effective width of the second gate pattern.

3. The method of claim 1, further comprising determining the second voltage and the third voltage when a set of carriers reach junction boundaries of the first and third MOSFETs, respectively.

4. The method of claim 3, wherein determining the second voltage comprises:
   sweeping voltages between the first gate pattern and the substrate with the source/drain of the first MOSFET grounded and measuring capacitances related to each of the voltages;
   removing the parasitic capacitance from the measured capacitance to determine actual capacitances excluding the parasitic capacitance;
   differentiating the capacitances excluding the parasitic capacitance to obtain differentiated capacitances; and
   determining a maximum absolute value of the differentiated capacitances as the second voltage.

5. The method of claim 3, wherein determining the third voltage comprises:
   measuring capacitances at a plurality of voltages by sweeping voltages between the third gate pattern and the substrate with the source/drain of the third MOSFET grounded and measuring capacitances related to each of the voltages;
   removing the parasitic capacitance from the measured capacitance to determine actual capacitances excluding the parasitic capacitance;
   differentiating the capacitances excluding the parasitic capacitance to obtain differentiated capacitances; and
   determining a maximum absolute value of the differentiated capacitances as the third voltage.

6. The method of claim 1, wherein the third effective width is substantially the same as the first effective width, and wherein determining the third and fourth capacitances comprises:
applying the second voltage between the first gate pattern and the substrate with the source/drain of the first MOSFET grounded and measuring the preliminary third capacitance;
subtracting the parasitic capacitance from the preliminary third capacitance to obtain the third capacitance;
applying the third voltage between the third gate pattern and the substrate with the source/drain of the third MOSFET grounded and measuring the preliminary fourth capacitance; and
subtracting the parasitic capacitance from the preliminary fourth capacitance to obtain the fourth capacitance.

7. The method of claim 1, wherein the third effective width is different from the first effective width, and
wherein determining the third and fourth capacitances comprises:
applying the second voltage between the first gate pattern and the substrate with the source/drain of the first MOSFET grounded measuring the preliminary third capacitance;
subtracting the parasitic capacitance from the preliminary third capacitance to obtain the third capacitance;
applying the third voltage between the third gate pattern and the substrate with the source/drain of the third MOSFET grounded measuring a primary preliminary fourth capacitance;
calculating a secondary preliminary fourth capacitance, when the third effective width of the third MOSFET is a fraction of the first effective width based on the primary preliminary fourth capacitance; and
subtracting the parasitic capacitance from the secondary preliminary fourth capacitance to obtain the fourth capacitance.

8. The method of claim 1, wherein determining the overlap length comprises:
calculating a gate length, when capacitances between the first, second and third gate patterns and the substrate in the MOSFETs are approximately zero, based on the third and fourth capacitances corresponding to a length difference between the first gate pattern and the third gate pattern; and
multiplying the gate length by ½ to obtain the overlap length.

9. The method of claim 1, wherein the effective channel length is calculated from an equation:

$$Lgate + X_L - 2Lov,$$

wherein the Lgate represents a length of the gate pattern, the $X_L$ indicates an offset factor generated in a process for forming the gate pattern, and the Lov is the overlap length.

10. The method of claim 1, wherein each of the first, second and third gate patterns each comprises gate fingers that have substantially the same widths and are arranged in parallel with each other, and in each of the first, second and third patterns the gate fingers comprise ends connected to each other.

11. The method of claim 10, wherein the gate fingers of the first gate pattern have a length substantially the same as that of the gate fingers of the second gate pattern, and the number of gate fingers in the first gate pattern is different from the number of gate fingers in the second gate pattern.

12. The method of claim 1, wherein the first, second and third MOSFETs are formed having substantially the same:
impurity conditions in the source/drain;
gate oxide layers,
gate electrode materials,
thicknesses of the gate oxide layer,
thicknesses of the gate electrode, and
substrates.

13. A method of measuring an effective channel length and an overlap length in a MOSFET, comprising:
forming a first MOSFET, a second MOSFET and a third MOSFET on a substrate, the first MOSFET including a first gate pattern that has N number of gate fingers having a first length and a first width, the second MOSFET including a second gate pattern that has M number of gate fingers having the first length and the first width, and the third MOSFET including a third gate pattern that has L number of gate fingers having a second length and the first width;
determining a parasitic capacitance between the first, second and third gate patterns and the substrate in the first, second and third MOSFETs, based on first and second capacitances, which are measured by applying a first voltage between the first and second gate patterns and the substrate and a capacitance obtained when the number of the gate fingers is approximately zero;
determining the second and third voltages as voltages obtained when carriers reach junction boundaries of the first and third MOSFETs, respectively;
applying the second voltage between the first gate pattern and the substrate in the first MOSFET and the third voltage between the third gate pattern and the substrate in the third MOSFET and measuring a preliminary third capacitance and a preliminary fourth capacitance;
determining a third capacitance and a fourth capacitance by excluding the parasitic capacitance from the preliminary third and fourth capacitances to obtain;
calculating a gate length, when capacitances between the first, second and third gate patterns and the substrate are approximately zero, based on the third and fourth capacitances;
multiplying the gate length by ½ to obtain an overlap length; and
determining effective channel lengths of the first, second and third gate patterns based on the overlap length.

14. The method of claim 13, wherein determining the second voltage comprises:
sweeping voltages between the first gate pattern and the substrate with the source/drain of the first MOSFET grounded and measuring capacitances related to each of the voltages;
removing the parasitic capacitance from the measured capacitance to determine actual capacitances excluding the parasitic capacitance;
differentiating the capacitances excluding the parasitic capacitance to obtain differentiated capacitances; and
determining a maximum absolute value of the differentiated capacitances as the second voltage.

15. The method of claim 13, wherein determining the third voltage comprises:
sweeping voltages between the third gate pattern and the substrate with the source/drain of the third MOSFET grounded and measuring capacitances related to each of the voltages;
removing the parasitic capacitance from the measured capacitance to determine actual capacitances excluding the parasitic capacitance;
differentiating the capacitances excluding the parasitic capacitance to obtain differentiated capacitances; and determining a maximum absolute value of the differentiated capacitances as the third voltage.

16. The method of claim 13, wherein the number of the gate fingers in the first MOSFET is substantially the same as that of the gate fingers in the third MOSFET, and
wherein determining the third and fourth capacitances comprises:
applying the second voltage between the first gate pattern and the substrate with the source/drain of the first MOSFET grounded and measuring the preliminary third capacitance;
subtracting the parasitic capacitance from the preliminary third capacitance to obtain the third capacitance;
applying the third voltage between the third gate pattern and the substrate with the source/drain of the third MOSFET grounded and measuring the preliminary fourth capacitance; and
subtracting the parasitic capacitance from the preliminary fourth capacitance to obtain the fourth capacitance.

17. The method of claim 13, wherein the number of the gate fingers in the first MOSFET is different from that of the gate fingers in the third MOSFET, and
wherein obtaining the third and fourth capacitances comprises:
applying the second voltage between the first gate pattern and the substrate with the source/drain of the first MOSFET grounded and measuring the preliminary third capacitance;
subtracting the parasitic capacitance from the preliminary third capacitance to obtain the third capacitance;
applying the third voltage between the third gate pattern and the substrate with the source/drain of the third MOSFET grounded and measuring a primary preliminary fourth capacitance;
calculating a secondary preliminary fourth capacitance, when the third effective width of the third MOSFET is a fraction of the first effective width, based on the primary preliminary fourth capacitance; and
subtracting the parasitic capacitance from the secondary preliminary fourth capacitance to obtain the fourth capacitance.

18. The method of claim 13, wherein the effective channel length is calculated from an equation:

$$Lgate + X_L - 2Lov,$$

wherein the Lgate represents a length of the gate pattern, the $X_L$ indicates an offset factor generated in a process for forming the gate pattern, and the Lov is the overlap length.

19. The method of claim 13, wherein determining the parasitic capacitance comprises:
plotting the first and second capacitances by the number of the gate fingers on a graph of which an X-axis represents the number of the gate fingers and a Y-axis represents a voltage between the gate patterns and the substrate;
drawing a straight line along the graphed first and second capacitances; and
determining a capacitance at which the straight line intersects with the Y-axis as the parasitic capacitance.

20. The method of claim 13, wherein calculating the gate length comprises:
plotting the first and second capacitances by the gate length on a graph of which an X-axis represents the gate length and a Y-axis represents a capacitance between the gate patterns and the substrate excluding the parasitic capacitance;
drawing a straight line along the graphed first and second capacitances; and
determining the gate length where the straight line intersects with the X-axis.

* * * * *